(12) United States Patent
Watabe et al.

(10) Patent No.: US 7,294,779 B2
(45) Date of Patent: Nov. 13, 2007

(54) SOLAR CELL AND METHOD FOR PRODUCING THE SAME

(75) Inventors: Takenori Watabe, Annaka (JP); Hiroyuki Ohtsuka, Annaka (JP); Masatoshi Takahashi, Annaka (JP); Satoyuki Ojima, Annaka (JP); Takao Abe, Annaka (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 795 days.

(21) Appl. No.: 10/470,242

(22) PCT Filed: Jan. 30, 2002

(86) PCT No.: PCT/JP02/00702

§ 371 (c)(1),
(2), (4) Date: Jul. 25, 2003

(87) PCT Pub. No.: WO02/061851

PCT Pub. Date: Aug. 8, 2002

(65) Prior Publication Data

US 2004/0065362 A1 Apr. 8, 2004

(30) Foreign Application Priority Data

Jan. 31, 2001 (JP) .............................. 2001-024240
Feb. 27, 2001 (JP) .............................. 2001-052285
Mar. 14, 2001 (JP) .............................. 2001-071610

(51) Int. Cl.
*H01L 31/0236* (2006.01)

(52) U.S. Cl. .................... 136/256; 136/252; 438/57

(58) Field of Classification Search ........ 136/243–292; 438/57

See application file for complete search history.

(56) References Cited

U.S. PATENT DOCUMENTS

| 4,379,944 | A | | 4/1983 | Borden et al. |
|---|---|---|---|---|
| 4,453,030 | A | * | 6/1984 | David et al. ................ 136/256 |
| 4,608,451 | A | * | 8/1986 | Landis ....................... 136/256 |
| 4,626,613 | A | | 12/1986 | Wenham et al. |
| 5,704,992 | A | | 1/1998 | Willeke et al. |
| 6,172,297 | B1 | | 1/2001 | Hezel et al. |

FOREIGN PATENT DOCUMENTS

DE  40 33 658  4/1992

(Continued)

OTHER PUBLICATIONS

Yang, S. M., and Ozin, G. A., Opal Chips: vectorial growth of colloidal crystal patterns inside silicon wafers, Chemical Communications, 2000, pp. 2507-2508.*

(Continued)

*Primary Examiner*—Nam Nguyen
*Assistant Examiner*—Anthony Fick
(74) *Attorney, Agent, or Firm*—Snider & Associates; Ronald R. Snider

(57) ABSTRACT

A solar cell 1 has a number of grooves 2 formed in parallel with each other on a first main surface 24a of a silicon single crystal substrate. An electrode 6 is formed on the inner side face of each groove 2 on one side. Each groove 2 is formed in the direction in disagreement with the <110> direction on the first main surface 24a. This raises mechanical strength of the solar cell 1. The direction of formation of the grooves 2 preferably crosses the <110> direction nearest to the direction of formation at an angle of 4°~45° on the acute angle side.

42 Claims, 13 Drawing Sheets

FOREIGN PATENT DOCUMENTS

| | | |
|---|---|---|
| JP | 3-288476 | 12/1991 |
| JP | 4-504033 | 7/1992 |
| JP | 8-213348 | 8/1996 |
| JP | 10-261810 | 9/1998 |
| JP | 2002-305313 | 10/2002 |

OTHER PUBLICATIONS

Hezel, R., et at., "A New Strategy for the Fabrication of Cost-Effective Silicon Solar Cells," *Renewable Energy*, May 1998, vol. 14, Nos. 1-4, pp. 83-88.

Hezel, R., et al., "Next Generation of Industrial Silicon Solar Cells With Efficiencies Above 20%," Photovoltaic Specialists Conference, 2000, Conference Record of the 28th IEEE, Sep. 2000, pp. 184-187.

Ebong, A.U. et al., "High Efficiency Double Sided Buried Contact Silicon Solar Cells," *Japanese Journal of Applied Physics*, Apr. 1996, pp. 2077-2080, vol. 35, No. 4A.

J. Dicker et al., "Analysis of Rear Contacted Solar Cell Structures for Cost-Effective Processes and Materials," *Photovoltaic Specialists Conference, 2000 Conference Record of the 28th IEEE*, Sep. 15-22, 2000, pp. 387-390.

\* cited by examiner (a)

203,203'

(b)

203,203'
204,204'
203a,203a'

(c)

202,214
203,203'
204,204'

(d)

202,214
203,203'
204,204'
210

SOLAR CELL AND METHOD FOR PRODUCING THE SAME

TECHNICAL FIELD

This invention relates to a solar cell excellent in the mechanical strength, and a method of fabricating the solar cell.

BACKGROUND ART

A method of fabricating a solar cell according to the OECO (Obliquely Evaporated Contact) process is disclosed for example in *Renewable Energy*, Vol. 14, p.83 (1998). The OECO process is a method of fabricating solar cells proposed by R. Hezel et al. of Institut für Solarenergieforschung GmbH Ha meln/Emmerthal (ISFH), Germany. A representative structure of a light-receiving surface of the OECO solar cell is schematically shown in FIG. 2 (a solar cell fabricated by the OECO process may occasionally be referred to as OECO solar cell, hereinafter). The OECO solar cell is configured so that a plurality of parallel grooves are formed on the main surface of a silicon single crystal substrate, which will serve as the light-receiving surface 3 later, and so that electrodes 6 for extracting output are formed on the inner side faces of the individual grooves on a single side as viewed along the width-wise direction of the grooves. This constitution successfully reduced the shadowing loss of the solar cell to as small as approx. 5% of the total light-receiving area. Because a typical solar cell having the electrodes formed by the screen printing method generally suffers from a shadowing loss of as large as approx. 12%, it is understood that the OECO solar cell has a sharply reduced shadowing loss, and that a large energy conversion efficiency is attainable.

In recent years, there is a strong demand for cost reduction in fabrication of the solar cells. More specifically, thinning of solar cells can reduce the amount of single crystal silicon per unit area used for the solar cells, and can reduce the cost to some extent. Thinning of the OECO solar cell, which requires a large number of grooves to be formed on the main surface, however undesirably tends to reduce the mechanical strength.

Besides those described in the above, there are known various solar cells having modified shapes of the electrodes formed on the light-receiving surface or back surface of the cell in order to improve the conversion efficiency. One publicly-known example of the solar cell is such as having grooves or bottomed holes for forming electrode contact mechanically carved or bored in the semiconductor single crystal substrate, and having metal for composing the electrodes filled in the grooves or bottomed holes. This type of cell was presented by two research groups at the 28th IEEE Photovoltaic Specialists Conference held in Anchorage in 2000.

The method by which the groove portions for forming electrode contact of the solar cell are mechanically carved, and the method by which the bottomed holes for forming electrode contact are mechanically bored were proposed independently by Institut für Solarenergieforschung GmbH Hameln/Emmerthal, Germany, and Fraunhofer Institute for Solar Energy Systems ISE, Germany, respectively. Specific procedures for carving the groove portions for forming electrode contact are such as follows. First, a plurality of nearly-parallel groove portions for forming electrode contact are mechanically carved on a semiconductor single crystal substrate (e.g., silicon single crystal substrate) having an insulating film such as a silicon oxide film (or silicon nitride film) formed thereon. Depth of the groove portions is set to 5 to 50 μm, and width thereof to several-hundred micrometers or around. The groove portions can be carved by scanning once or several times over the substrate with a high-speed rotary blade having several hundreds to thousands cutting edges. After the carving of the groove portions, a metal is uniformly deposited on the main surface to thereby form an electrode layer.

It is also possible to form bottomed holes for forming the electrode contact so as to be linearly aligned at regular intervals. Depth of the bottomed holes herein is again set to 5 to 50 μm similarly to the case where the groove portions are formed, and diameter of the opening of the bottomed holes is set to several-hundred micrometers or around. This type of bottomed holes can be bored by irradiating predetermined sites with KrF excimer laser, Nd:YAG laser or the like.

Thus-fabricated solar cells, being passivated with the insulating film in the non-contact area of the surface thereof, are advantageous in suppressing surface recombination of photo-generated carriers, and in consequently raising the conversion efficiency of the solar cells. This process is also advantageous in that the groove portions and bottomed holes for forming electrode contact can be formed in a relatively simple manner because formation thereof needs no photolithographic technique.

On the other hand, strong demands focused on the solar cells at present are improvement in the energy conversion efficiency and cost reduction. Among others, the cost reduction can be realized by thinning of the solar cells to thereby reduce the amount of silicon single crystal substrate used for the cells. Thinning of the semiconductor single crystal substrate, however, undesirably lower the mechanical strength of the resultant solar cells. This inventors further revealed that formation of the electrodes by carving or boring the groove portions or bottomed holes in the semiconductor single crystal substrate inevitably causes damages to the substrate per se, and this may further degrade the mechanical strength.

It is therefore a subject of this invention to provide a solar cell excellent in the mechanical strength, and a method of fabricating the solar cell.

DISCLOSURE OF THE INVENTION

As a solution to the aforementioned subject, a solar cell according to a first aspect of this invention is configured so as to have a plurality of grooves nearly parallel with each other formed on a first main surface of a semiconductor single crystal substrate having a surface orientation of nearly {100}, each of the grooves having an electrode for extracting output disposed on the inner side face thereof on one side in the width-wise direction thereof (referred to as the OECO solar cell, hereinafter), and the grooves being formed on the first main surface in directions in disagreement with the <110> direction which means the directions [110], [−110], [101], [−101], [011] and [0−11].

In the conventional process of fabricating the aforementioned OECO solar cells, no attention has been paid on the direction of formation of the grooves formed on the main surface of the substrate. Investigations by this inventors, however, found out that when a large number of grooves are formed along the <110> direction on the major surface of a semiconductor single crystal substrate having a surface orientation of nearly {100} (simply referred to as the {100} substrate, hereinafter), the grooves may have portions where stress tends to concentrate when viewed along its sectional contour, and the substrate may readily cleave along the grooves and result in fracture even under an action of slight external force when a lot of damage produced during the groove formation remains in the substrate.

Therefore in the first aspect of this invention, direction of formation of the grooves formed on the first main surface of the {100} substrate is set in disagreement with the <110> direction. This successfully raises the mechanical strength of the substrate and consequently of the resultant solar cells to a large extent, and effectively prevents or suppresses nonconformities such as factures from occurring during handling of the final products or intermediate products of the solar cells even when the substrate has an extra-thin design.

Next, a solar cell according to a second aspect of this invention is configured so as to have a plurality of filled electrode lines, having an electric conductor for composing electrodes for extracting output filled therein, on at least either main surface side of a semiconductor single crystal substrate having a surface orientation of nearly {100}, and the filled electrode lines are formed in directions in disagreement with the <110> direction on the main surface in order to solve the aforementioned subject.

Moreover, a method of fabricating a solar cell of this invention, intended for fabricating the solar cell according to the second aspect, comprises a step of forming a plurality of filled electrode lines, having an electric conductor for composing electrodes for extracting output filled therein, on at least either main surface side of a semiconductor single crystal substrate having a surface orientation of nearly {100}, in directions in disagreement with the <110> direction on the main surface. The electric conductor for composing electrodes in this invention may comprise a metal layer, transparent conductive layer, or a stack of these layers.

It is to be noted that the "filled electrode line" in the context of this invention is a general term for expressing the one fabricated by forming recessed portions on the main surface of the semiconductor single crystal substrate so as to concave the main surface, and by filling the recessed portions with an electric conductor for composing the electrodes, where the recessed portions are formed on the main surface of the semiconductor single crystal substrate so as to be aligned in a linear pattern. For example, the filled electrode line may be such as comprising a plurality of grooves formed on the main surface of the semiconductor single crystal substrate, and an electrode conductor for composing the electrodes filled in the grooves. Another possible example relates to the one fabricated by forming bottomed holes on the main surface of the semiconductor single crystal substrate linearly aligned at regular intervals, and by filling the recessed portions with an electric conductor for composing the electrodes. It is to be noted now that the direction of formation of the filled electrode line is defined as the linear direction along which the recessed portions are formed in a linear pattern. For example, for the case where the groove portions are formed as the recessed portions, the direction of formation is defined as the longitudinal direction of the groove portions, and for the case where the bottomed holes are formed as the recessed portions, the direction of formation is defined as direction of a line connecting every closest bottomed holes.

If the above-descried filled electrode lines are formed on the main surface of the semiconductor single crystal substrate having a surface orientation of {100} (may occasionally referred to simply as {100} substrate, hereinafter) along the <110> direction on the main surface of the substrate, the substrate may readily cleave along the direction of formation thereof and result in fracture, similarly to the case for the solar cell according to the first aspect. The mechanical strength of the substrate and consequently the resultant solar cell can, however, be improved to a large extent similarly to the solar cell according to the first aspect, if the direction of formation of the filled electrode lines formed on the main surface of the {100} substrate is set in disagreement with the <110> direction. Moreover, in the method of fabricating the solar cell, it is also possible to effectively prevent or suppress nonconformities such as factures of the semiconductor single crystal substrate from occurring during the fabrication process of the solar cell, if the filled electrode lines are formed so that the direction of formation thereof is set in disagreement with the <110> direction.

BRIEF DESCRIPTION OF THE DRAWINGS

FIG. 10(*b*) is a view schematically showing a sectional structure of FIG. 10(*a*);

BEST MODE FOR CARRYING OUT THE INVENTION

The following paragraphs will describe best modes for carrying out this invention making reference to the attached drawings, where it is to be understood that this invention is by no means limited to these best modes.

First Embodiment 1

Figure 1:
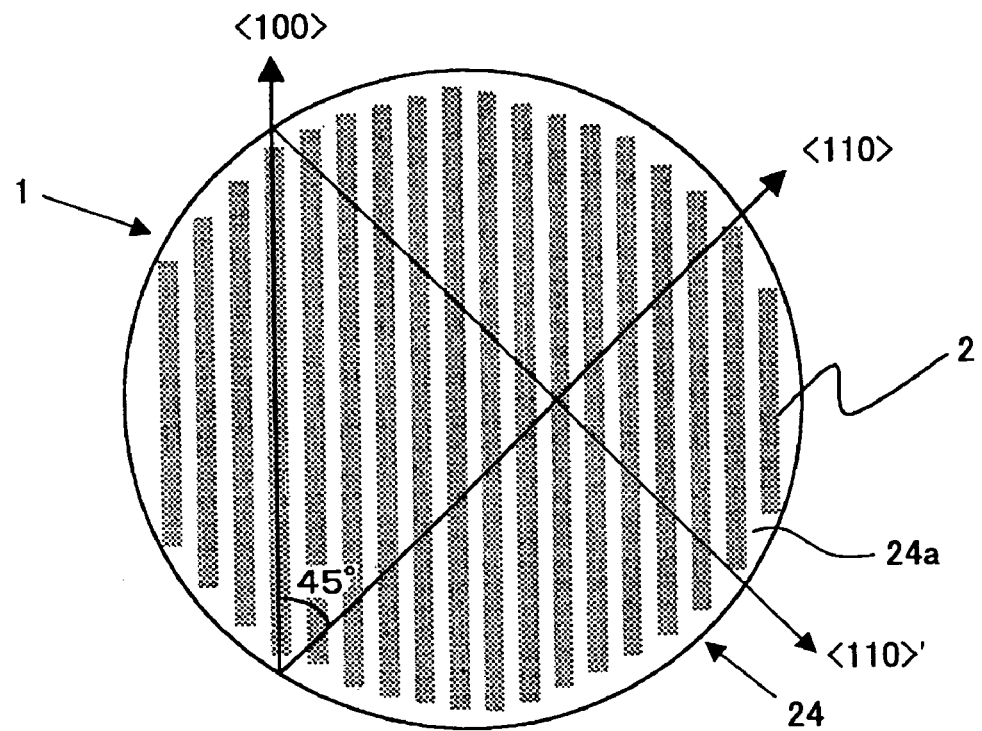
FIG. 1 is a drawing showing a relation between the groove direction and crystallographic orientation of the substrate of an OECO solar cell as an exemplary solar cell according to a first aspect of this invention.
Figure 2:
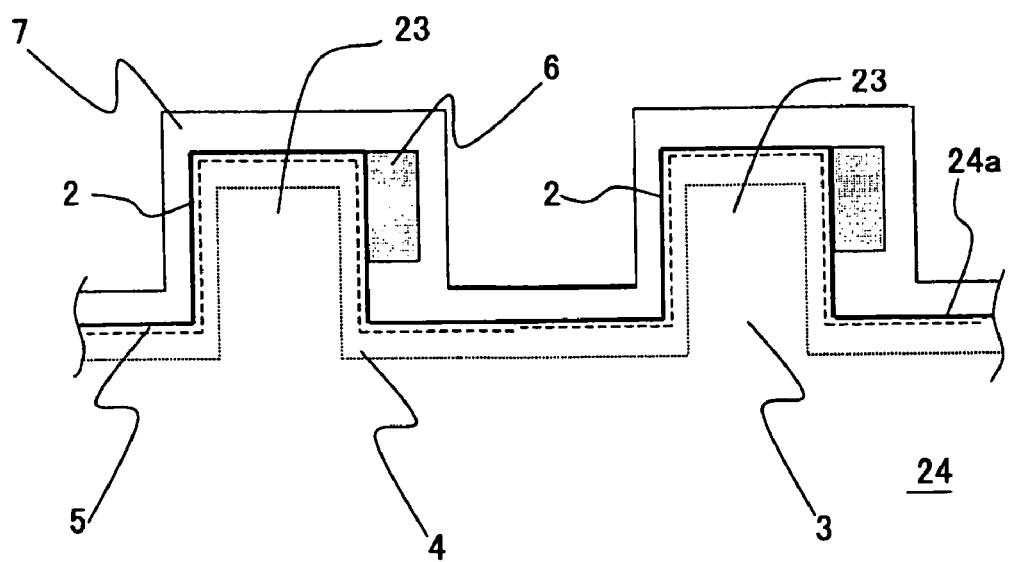
FIG. 2 is a drawing exemplifying a sectional structure of an essential portion of the surface of the OECO solar cell as an exemplary solar cell according to the first aspect of this invention.

FIG. 1 is a drawing showing an embodiment of the solar cell according to the first aspect of this invention. FIG. 2 is a schematic enlarged sectional view showing a structure on the first main surface 24*a* side of the solar cell 1. The solar cell 1 is configured so that a large number of grooves 2 of several-hundred-micrometers wide and approx. 100 μm deep are formed in parallel on the first main surface 24*a* of a p-type silicon single crystal substrate sliced out from a silicon single crystal ingot. These grooves 2 can be carved en bloc using a set of hundreds to thousands of concentrically-joined rotary blades which rotate all together, where it is also allowable to divide the carving operation into several numbers of run.

On the first main surface 24*a* of the substrate having the grooves 2 thus formed thereon, an emitter layer 4 is formed by thermally diffusing phosphorus as an n-type dopant, so as to produce a p-n junction portion. Over the p-n junction, a thin silicon oxide film 5 which functions as a tunnel insulating film is formed typically by the thermal oxidation process.

On the silicon oxide film 5, electrodes 6 are formed. The electrodes 6 are such as those formed by depositing an electrode material (e.g., metal such as aluminum) on the inner side face of the grooves using a vacuum evaporation apparatus, where in the process of deposition, the substrate 1 is disposed as being relatively inclined at a least-necessary angle or more, so as to allow the electrode material to deposit on the inner side face predominantly on one side in the width-wise direction of each groove, as described later.

This is where the name of OECO comes from. While excessive electrode material deposits also on the top surface of the projected ridges 23 formed between every closest grooves 2, 2 during the deposition, the excessive portion can be removed using an etching solution such as hydrochloric acid solution. The entire portion of the first main surface 24*a* of the substrate 1 including the electrodes 6 are covered with a silicon nitride film 7 which functions as a protective film and an anti-reflection film.

The individual grooves 2 of the solar cell 1 are formed in the direction in disagreement with the <110> direction on the first main surface 24*a*. This successfully raises the mechanical strength of the solar cell 1. It is to be understood in this specification that any substrate is assumed as having a surface orientation of {100} if the crystallographic principal axis of the single crystal substrate used herein is an off-angled substrate having an angle of inclination of up to 6° away from the <100> direction.

As shown in FIG. 1, the main surface of the {100} substrate has two <110> directions normal to each other, and the grooves 2 are formed so as to agree with neither of the <110> directions. The direction of formation of each groove herein preferably crosses the <110> direction nearest to the direction of formation at an angle of 4° to 45° on the acute angle side. An angle smaller than 4° may result in only a limited effect of improvement in the mechanical strength of the solar cell as compared with the case where the groove direction agrees with the <110> direction. On the other hand, it is geometrically impossible for the angle to exceed 45° away from both <110> directions. The direction of formation of the grooves becomes most distant from the <110> direction, which is a direction of easy cleavage, when it is in parallel with the <100> direction on the first main surface 24*a* (i.e., the above angle equals to 45°), where maximum effect of raising the mechanical strength of the solar cell is attainable.

Figure 3A:
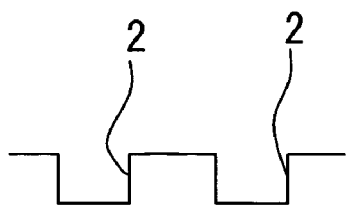
FIG. 3A is a drawing showing a first example of a sectional structure of the surface grooves of the OECO solar cell as an exemplary solar cell according to the first aspect of this invention.
Figure 3B:
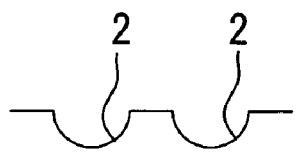
FIG. 3B is a drawing showing a second example of the same.
Figure 3C:
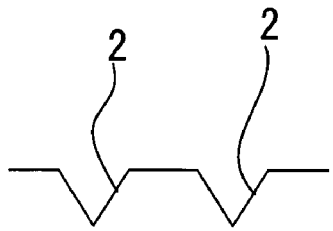
FIG. 3C is a drawing showing a third example of the same.

Each groove 2 preferably has either rectangular contour in a sectional view normal to the longitudinal direction thereof as shown in FIG. 3A, semicircular contour as shown in FIG. 3B, and V-contour as shown in FIG. 3C, because these morphologies can readily be obtained by cutting using a peripheral blade cutting. In particular for the purpose of reducing the series resistance of the solar cell, it is preferable to adopt the groove having the rectangular section as shown in FIG. 3A.

Figure 3D:
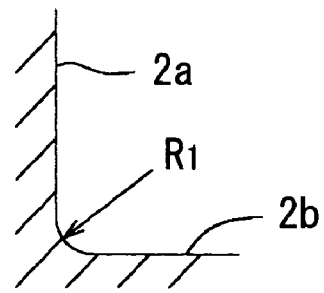
FIG. 3D is a drawing showing a fourth example of the same.
Figure 3E:
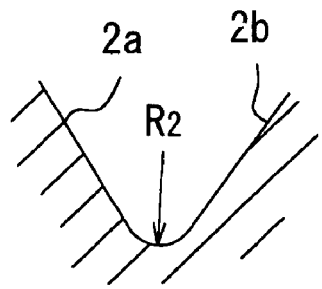
FIG. 3E is a drawing showing a fifth example of the same.

For the case where the groove 2 has a rectangular contour in a sectional view normal to the longitudinal direction thereof as shown in FIG. 3A, or V-contour as shown in FIG. 3C, the contour has two edge portions 2*a*, 2*b* abutted with each other as shown in FIG. 3D or FIG. 3E. In an rectangular groove, the edge portions 2*a* and 2*b* correspond to the side wall and bottom of the groove, respectively, as shown in FIG. 3D, showing an angle of abutment of the both of 90° or around. On the other hand, V-formed groove has the edge portions 2*a*, 2*b* abutted at an acute angle at the bottom of the groove. Both cases tend to result in stress concentration and in lowered strength of the solar cell if the abutment is made at an acute angle. Provision of rounding R1 and R2 at the abutment position of the edge portions 2*a*, 2*b* as viewed in a sectional contour is now successful in further raising the mechanical strength of the solar cell.

Degrees of the rounding R1 and R2 are preferably set within a range which ensures a sufficient effect of preventing stress concentration, and which does not ruin effects such as reduction in the series resistance due to groove morphology, where a preferable range is typically 2 to 20 μm or around. The rounding can readily be produced by chemical etching after the grooves are carved by the peripheral blade cutting or the like. The chemical etching may be carried out in common with the etching for removing damage generated during the groove carving. Amount of etching is preferably within a range from 5 to 20 µm or around so as to make the rounding fall within the above described preferable range. Aqueous potassium hydroxide solution is typically used as a chemical etching solution.

Next paragraphs will describe an exemplary method of fabricating the solar cell 1.

First a p-type silicon single crystal ingot, which is prepared by adding a Group III element such as gallium to a high-purity silicon, is obtained, and p-type silicon single crystal substrates having a surface orientation of {100} are sliced out from the ingot. The p-type silicon single crystal substrate typically has a specific resistance of 0.5 to 5 µ·cm. Next, as shown in process (a) of FIG. 4, a plurality of parallel grooves of 20 to 100 µm deep are formed on the first main surface 24a of the p-type {100} substrate using a high-speed rotary blade in a direction in disagreement with <110>, typically in the <100> direction. While the silicon single crystal ingot may be prepared by either of the CZ (Czochralski) method and the FZ (floating zone melting) method, it is more preferably prepared by the CZ method in view of the mechanical strength of the resultant substrate. While the thickness of the substrate of as small as 40 µm may ensure a sufficient mechanical strength, the thickness is more preferably 150 µm or more, and still more preferably 200 µm or more for the convenience of slicing operation. The effect of raising the mechanical strength through adoption of the groove morphology specific to this invention becomes distinctive when a substrate as thin as 230 µm or below is adopted.

Figure 5A:
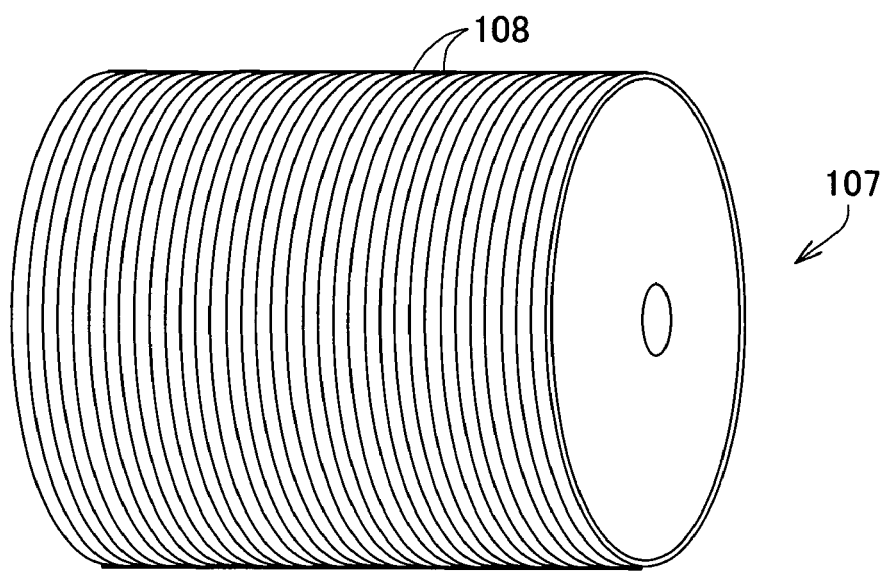
FIG. 5A is a perspective view schematically showing a high speed rotary blade used for fabrication of the OECO solar cell as an exemplary solar cell according to the first aspect of this invention.
Figure 5B:
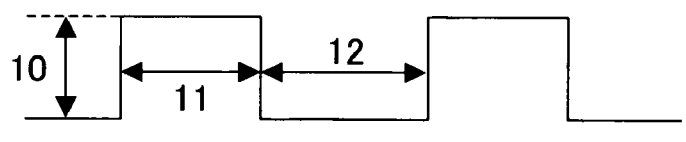
FIG. 5B is a drawing of a first example of an edge profile of a peripheral blade provided to the high-speed rotary blade shown in FIG. 5A.
Figure 5C:
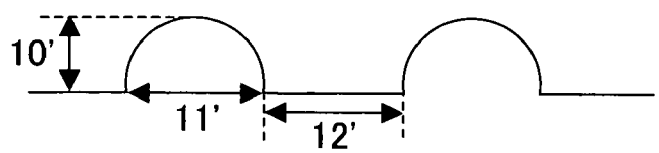
FIG. 5C is a drawing showing a second example of the same.
Figure 5D:
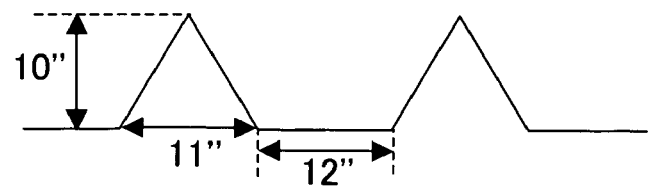
FIG. 5D is a drawing showing a third example of the same.

FIG. 5A shows a schematic view of a high-speed rotary blade 107. The high-speed rotary blade 107 comprises a cylindrical portion (e.g., 103 mm in diameter, 165 mm in length) and a plurality of (e.g., 100 to 200) peripheral cutting edges 108 for groove carving attached thereto. Profile of the cutting edge may properly be selected depending on the desired morphology of the groove (see FIGS. 3A to 3E) from an edge having a rectangular section as shown in FIG. 5B, an edge having a semicircular section as shown in FIG. 5C, and an edge having an angular section as shown in FIG. 5D. Heights 10, 10', 10" of the edges fall within a range from 50 to 100 µm for example, and widths 11, 11', 11" of the edges and distances 12, 12', 12" of edges are typically several hundred micrometers or around for example, respectively. Available blades include diamond blades (such as having the surface thereof uniformly adhered with diamond abrasive grain having a grain size of 5 µm to 10 µm). The grooves 2 can be curved by cutting the main surface of the substrate 1 using the aforementioned high-speed rotary blade at a cutting speed of approx. 1 to 4 cm per second while injecting a cutting fluid. It is also allowable to use a dicer or a wire saw in place of the high-speed rotary blade.

Next, damage generated in the substrate after the groove formation is removed by the aforementioned chemical etching. When the groove has a rectangular form or V forms as shown in FIG. 3A or 3C, conditions for the etching for removing the damage are preferably adjusted so as to properly round the grooves as shown in FIG. 3D or FIG. 3E. After completion of the etching for removing damages, a texture structure is then formed on the main surface of the substrate, which is carried out as a surface roughening for reducing the reflection loss, by any publicly-known methods such as anisotropic etching. After the texture is formed, the substrate is cleaned in an acidic aqueous solution such as containing hydrochloric acid, sulfuric acid, nitric acid, hydrofluoric acid, or mixed solution thereof, where cleaning in hydrochloric acid is preferable from the viewpoints of economy and production efficiency.

Figure 4:
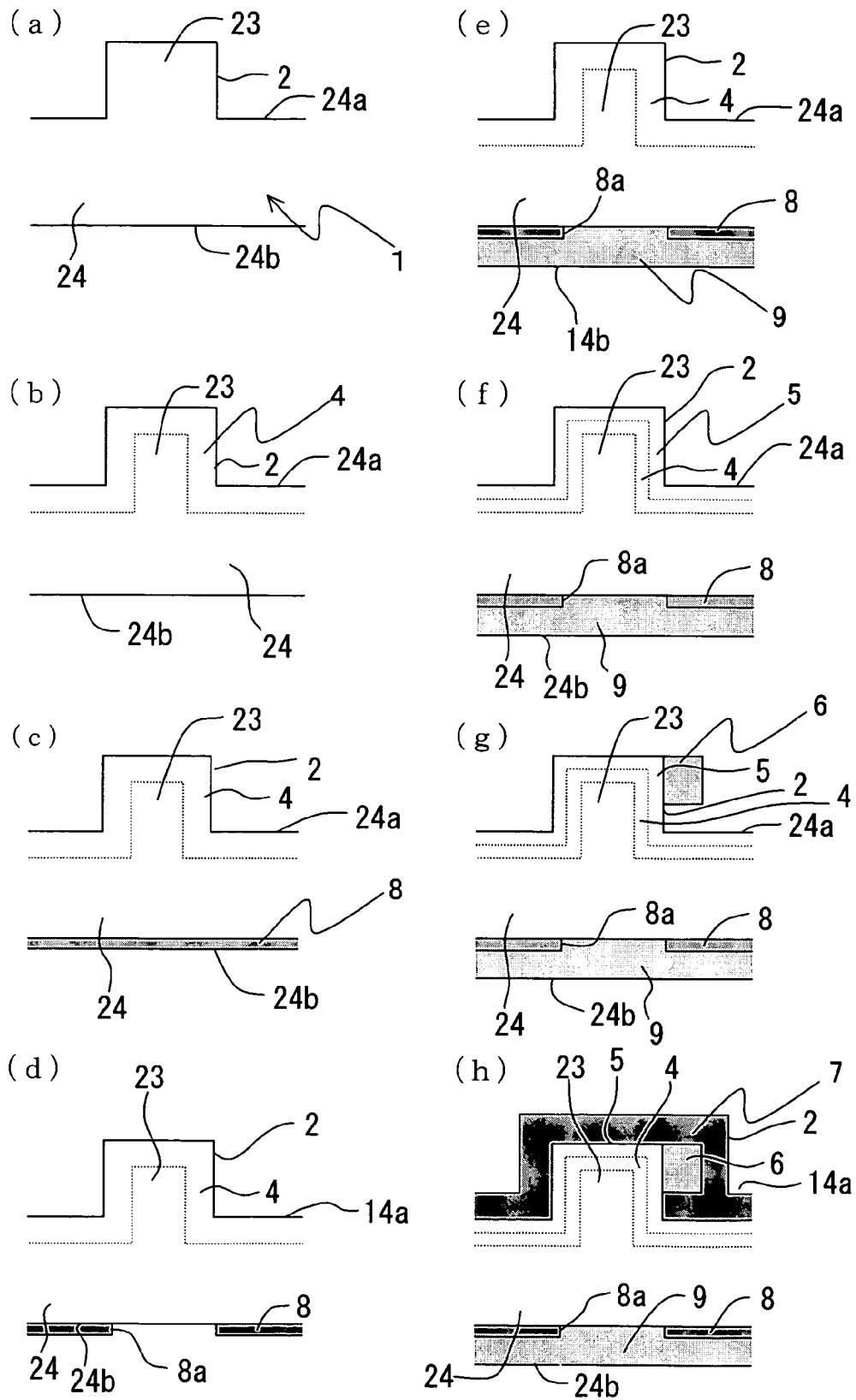
FIG. 4 is a drawing showing an outline of process steps for fabricating the OECO solar cell as an exemplary solar cell according to the first aspect of this invention.

Next, as shown in process (b) in FIG. 4, an emitter layer 4 is formed in the surficial portion of the substrate after cleaning. Methods of forming the emitter layer may be any of the coating diffusion method using diphosphorus pentaoxide, ion implantation method for directly implanting phosphorus ion, and so forth, but a preferable method from the economical viewpoint is the vapor-phase diffusion method using phosphoryl chloride. In an exemplary process, the n-type emitter layer 4 can be formed by annealing the substrate in a phosphoryl chloride atmosphere at 850° C. or around. Thickness of the emitter layer 4 is typically 0.5 µm or around, and the sheet resistance is within a range from 40 to 100 Ω/□ or around. A phosphorus glass formed in the surficial portion of the substrate during the process is removed in a hydrofluoric acid solution.

Next, electrode is formed on a second main surface 24b side. First, as shown in process (c) in FIG. 4, a silicon nitride layer 8 is formed as a passivation film on the second main surface 24b. The silicon nitride layer 8 can be formed by the CVD (Chemical Vapor Deposition) process. Any of the normal-pressure thermal CVD process, reduced-pressure thermal CVD process, photo CVD process and so forth is applicable herein, where the remote plasma CVD process is particularly preferable for this invention, because the process can proceed at lower temperatures ranging from 350 to 400° C. or around, and can reduce the surface recombination speed of the silicon nitride layer 8 to be obtained. It is to be noted that the direct thermal nitridation method is not preferable because the process cannot afford a sufficient thickness of the resultant layer.

Next as shown in process (d) in FIG. 4, grooves 8a for electrode connection are formed in thus-formed silicon nitride layer 8 so as to reach the underlying p-type silicon single crystal substrate 24 using the high-speed rotary blade similar to that shown in FIG. 5A. Profile of the cutting edge is selected from the rectangular form as shown in FIG. 5B, semicircular form as shown in FIG. 5C, and angular form as shown in FIG. 5D depending on a desired sectional form of the grooves. After the grooves 8a are thus formed, an electrode 9 is then formed so as to cover the grooves 8a together with the peripheral silicon nitride layer 8 as shown in process (e) in FIG. 4. Although silver or copper is available as the electrode material herein, aluminum (including alloys thereof) is most preferable in view of economy and workability. Aluminum can be deposited by either method of sputtering and vacuum evaporation. All processes for forming the electrode on the second main surface 24b side thus complete.

Next as shown in process (f) in FIG. 4, the silicon oxide film 5 is formed on the first main surface 24a by the thermal oxidation method. The silicon oxide film 5 serves as a tunnel insulating film between the electrode 6 on the first main surface 24a and the substrate 24, and preferably has a thickness of 5~30 Å in order to optimize tunneling effect while preventing short-circuiting. The silicon oxide film 5 can be formed by any known methods including dry oxidation, wet oxidation, steam oxidation, pyrogenic oxidation, hydrochloric acid oxidation and so forth, and among others, dry oxidation is preferably adopted since the method can ensure a high film quality and easy control of the thickness.

On the substrate 24 having the silicon oxide film 5 already formed thereon, the electrode 6 is formed on the inner side face (electrode-forming area) of the groove 2 on one side as viewed in the width-wise direction of the groove 2, typically to as thick as approx. 5 μm by the oblique-angled vacuum evaporation process. Although aluminum (including alloys thereof) is most preferably used herein for the electrode material, the material is not limited thereto, and other metal such as silver, copper or the like can be used. More specifically, the substrate 24 is placed in a vacuum evaporation apparatus so as to incline the principal axis thereof at 70° to 85° away from the referential position, where the referential position is defined as a position where the first main surface 24a is oriented to the evaporation source so that the extending direction of the grooves 2 crosses normal to the evaporation source. This placement successfully allows the electrode material to deposit predominantly on the inner side face of the grooves 2 on one side as viewed in the width-wise direction. The deposition is preferably effected only after the degree of vacuum in the apparatus reaches to a level as low as $2\times10^{-5}$ Pa or below, and the deposition speed is adjusted to 10~15 Å/sec (but not limited thereto). Next as shown in process (g) in FIG. 4, the substrate 24 having the electrodes 6 deposited thereon is dipped into an acidic aqueous solution containing hydrochloric acid, sulfuric aid, nitric acid, hydrofluoric acid or mixed solution thereof, to thereby remove the unnecessary portion of the electrode material deposited on the top surfaces of the projected ridges 23 generated between the adjacent grooves 2, 2. The removal is preferably proceeded typically in hydrochloric acid solution because an appropriate etching rate is attainable, and because unnecessary compound formation due to reaction with the underlying layer is less likely to occur.

On the substrate 24 after completion of the above processes, a bus bar electrode (not shown) is formed by a publicly-known method, and the silicon nitride film 7, which serves as a passivation film and an anti-reflection film, is uniformly formed on the first main surface 24a to a thickness of 600~700 Å typically by the remote plasma CVD process (process (h) in FIG. 4), to thereby complete the final solar cell 1.

Figure 11:
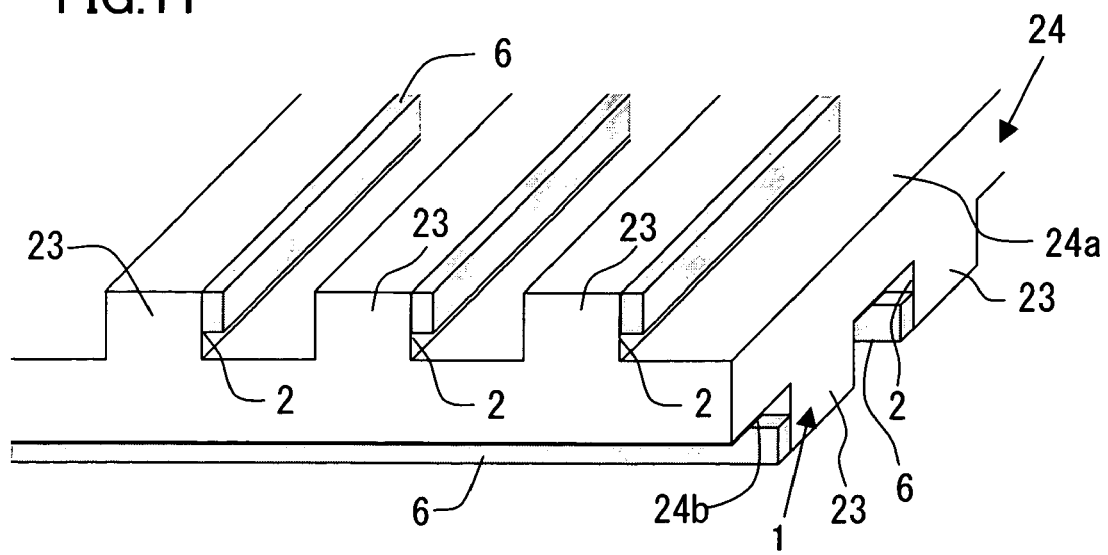
FIG. 11 is a perspective view of an essential portion of an OECO solar cell of double-face-receiving type.

In the solar cell of this invention, it is also allowable to form a light-receiving-element structure of the OECO solar cell also on the second main surface 24b side of the substrate 24 as shown in FIG. 11, similarly to as on the first main surface 24a side. In this case, it is preferable to adopt a structure in which a plurality of grooves 2 nearly parallel with each other are formed on the second main surface 24b of the silicon single crystal substrate (semiconductor single crystal substrate) 24 in directions in disagreement with the <110> direction on the first main surface 24a and so as to cross the directions of formation of the grooves 2 on the first main surface 24a, and in which an electrode for extracting output is disposed on the inner side face of each groove 2 on the second main surface 24b on one side in the width-wise direction of the groove 2. The difference in the directions of formation of the grooves 2 on the second main surface 24b side and of the grooves 2 on the first main surface 24a side successfully results in improved mechanical strength of the solar cell having grooves formed on both main surfaces thereof. It is most preferable to form the grooves 2 so that the direction of formation thereof on the second main surface 24b cross nearly normal to those on the first main surface 24a in view of optimizing the mechanical strength.

Second Embodiment

Figure 6A:
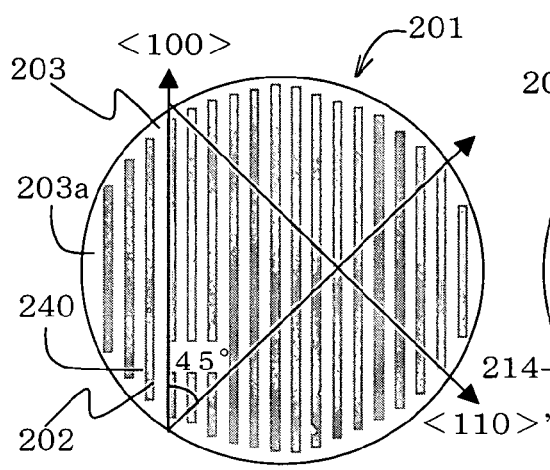
FIG. 6A is a drawing showing a relation between the groove arrangement and crystallographic orientation of the substrate of an embodiment of a solar cell adopting grooves for electrode contact according to a second aspect of this invention.
Figure 7:
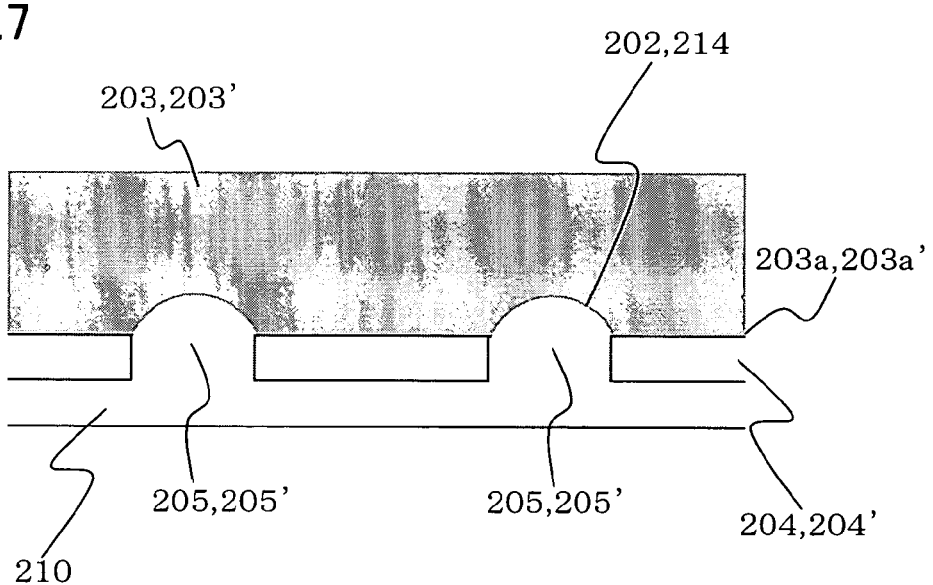
FIG. 7 is a drawing exemplifying a sectional structure of an essential portion of the back surface of the solar cell according to the second aspect of this invention.

FIG. 6A is a drawing showing an embodiment of a solar cell 201 according to the second aspect of this invention. FIG. 7 is an enlarged schematic sectional view showing a structure on a first main surface 203a side of the solar cell 201. In the solar cell 201, a large number of nearly-parallel groove portions 202 of approx. several-hundred-micrometers wide and approx. 100 μm deep are formed on a first main surface 203a (this surface is defined as the back surface in this embodiment) of a p-type silicon single crystal substrate 203 (also simply referred to as substrate 203), and the groove portions 202 are filled with an electric conductor 205 to thereby form filled electrode lines 240 (FIG. 6A). These groove portions 202 can be carved en bloc using a set of hundreds to thousands of concentrically-joined rotary blades which rotate all together, where it is also allowable to divide the carving operation into several numbers of run. While the description of this embodiment will be made on a p-type silicon single crystal substrate 203 sliced out from a silicon single crystal ingot, it is to be understood that this invention is by no means limited thereto.

In this embodiment, an insulating film 204 is formed on the first main surface 203a of the p-type silicon single crystal substrate (semiconductor single crystal substrate) 203, and the filled electrode lines 240 are formed so that the electric conductor 205 filled therein makes contact with the p-type silicon single crystal substrate 203 in a form that the groove portions 202 composing the filled electrode lines 240 penetrate the insulating film 204.

In the solar cell 201 of this embodiment, a current collecting electrode communicating with the filled electrode lines 240 is formed on the first main surface 203a, and is preferably formed as a cover electrode layer 210 covering entire surface of the first main surface 203a. The insulating film 204 formed on the p-type silicon single crystal substrate 203 may preferably comprise a silicon oxide film, silicon nitride film and the like.

In the above-described solar cell 201 of this embodiment, the first main surface 203a of the p-type silicon single crystal substrate 203 has a surface orientation of {100}, and the individual groove portions 202 composing the filled electrode lines are formed in the direction in disagreement with the <110> direction on the first main surface 203a. This successfully raises the mechanical strength of the solar cell 201. It is to be understood in this specification that any substrate is assumed as having a surface orientation of {100} if the crystallographic principal axis of the single crystal substrate used herein is an off-angled substrate having an angle of inclination of up to 6° away from the <100> direction.

As shown in FIG. 6A, the first main surface 203a of the {100} substrate has two <110> directions normal to each other, and the direction of formation of the groove portions 202 is set as being in disagreement with both of the <110> directions. The direction of formation of the groove portions 202 and the direction nearest thereto preferably cross at an angle of 4° to 45° on the acute angle side. An angle smaller than 40 may result in only a limited effect of improvement in the mechanical strength of the solar cell 201 as compared with the case where the groove direction agrees with the <110> direction. On the other hand, it is geometrically impossible for the angle to exceed 45° away from both of the <110> directions. The direction of formation of the groove portions 202 becomes most distant from the <110> direction, which is a direction of easy cleavage, when it is in parallel with the <100> direction on the first main surface 203a (i.e., the above angle equals to 45°), where maximum effect of raising the mechanical strength of the solar cell 201 is attainable.

Figure 6B:
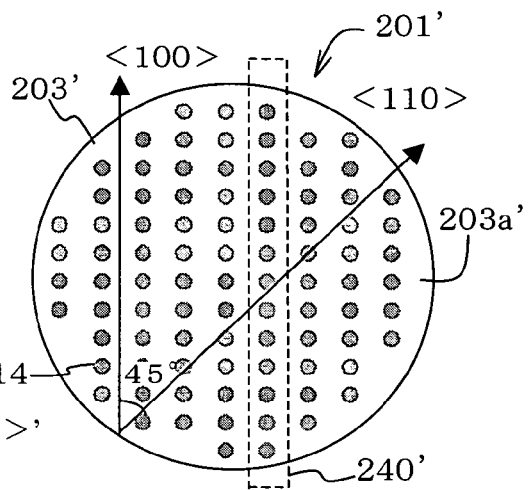
FIG. 6B is a drawing showing a relation between arrangement of bottomed holes and crystallographic orientation of the substrate of an embodiment of the solar cell adopting the bottomed holes according to the second aspect of this invention.
Figure 10:
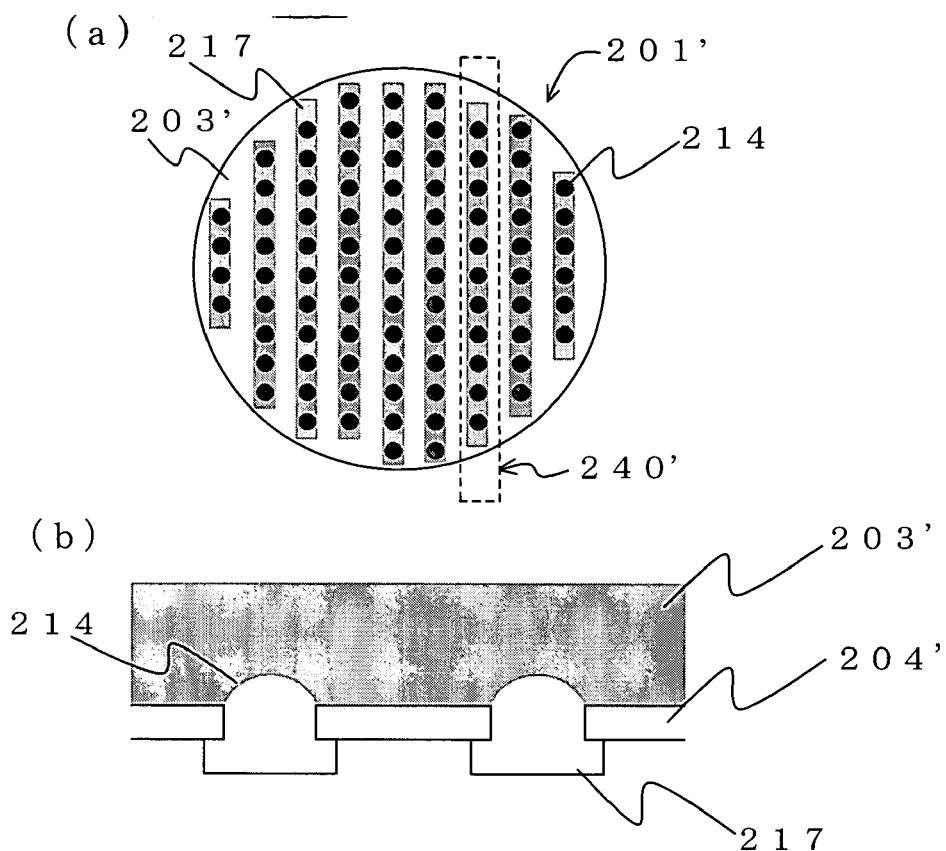
FIG. 10(*a*) is a drawing showing a positional relation between band-formed current collecting electrodes and bottomed holes used for the solar cell according to the second aspect of this invention.

Next, a solar cell 201' according to another embodiment of this invention is shown in FIG. 6B, FIG. 10(a) and FIG.

10(b). In the solar cell 201', a great number of bottomed holes 214 typically having a diameter of several hundred micrometers and a depth of 5 to 50 µm or around are formed on a main surface 203a' of a p-type silicon single crystal substrate 203', in a form that every closest bottomed holes 214 are linearly aligned at regular intervals. These bottomed holes 214 are filled with an electrode conductor 205' (see FIG. 7), and as a consequence arrays in which every closest bottomed holes 214 are linearly aligned at regular intervals configure filled electrode lines 240'. The filled electrode lines 240' are formed so as to penetrate the insulating film 204' as shown in FIG. 7. Assuming now that the direction of a line connecting every closest bottomed holes 214 as the direction of formation of the filled electrode lines 240', such direction of formation of the filled electrode lines 240' is in disagreement with the <110> direction on the first main surface 203'. The direction of formation of each filled electrode line 240 preferably crosses the <110> direction nearest thereto at an angle of 4° to 45° on the acute angle side as shown in FIG. 6B, similarly to the case where the filled electrode lines 240 are formed by the aforementioned groove portions 202 (see FIG. 10(a)), and more preferably lies in parallel with the <100> direction on the first main surface 203a' (at an angle of 45° to the <110> direction).

Figure 8:
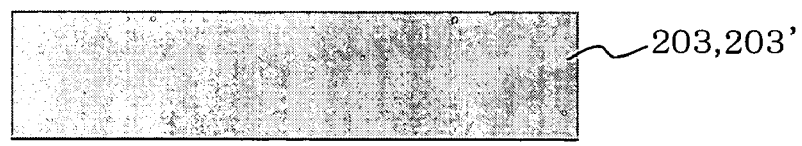
FIG. 8 is a drawing showing an outline of process steps for forming electrodes of the solar cell according to the second aspect of this invention.
Figure 8:
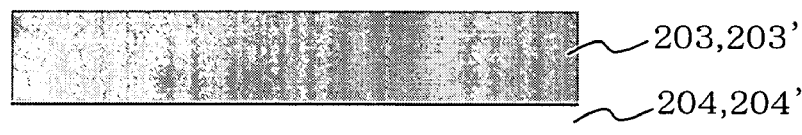
Figure 8:
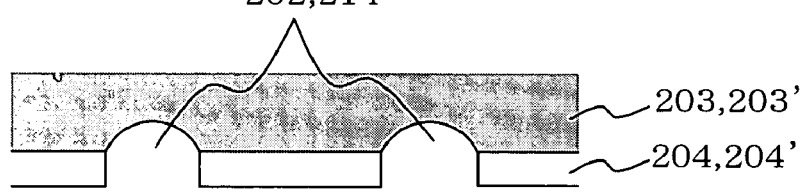
Figure 8:
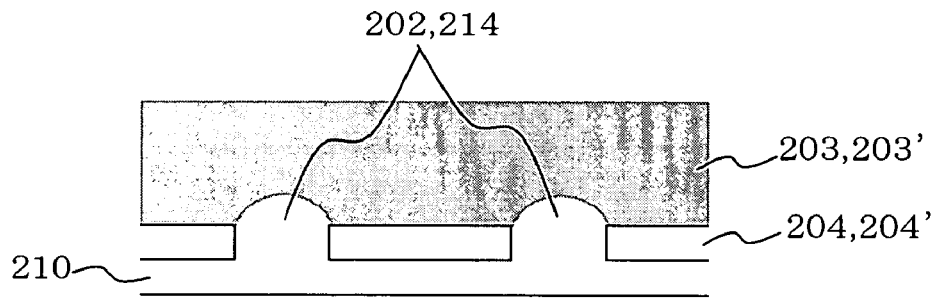

Next paragraphs will describe a method of fabricating the solar cells 201 (FIG. 6A) and 201' (FIG. 6B) referring to FIG. 8. It is to be understood that this invention is by no means limited to the solar cells fabricated by this method. Because the fabrication method of the solar cells 201 and 201' are similar to a large extent, any descriptions for the common portion will be represented by those for the solar cell 201, and corresponded portions of the solar cell 201' will be given in the parentheses so as to avoid redundant description.

First a silicon single crystal ingot, which is prepared by doping a Group III element such as boron or gallium to a high-purity silicon, is obtained, and p-type silicon single crystal substrates 203 (203') having a surface orientation of {100} are sliced out from the ingot. The p-type silicon single crystal substrate 203 (203') typically has a specific resistivity of 0.5 to 5 Ω·cm. While the silicon single crystal ingot may be prepared by either of the CZ (Czochralski) method and the FZ (floating zone melting) method, it is more preferably prepared by the CZ method in view of the mechanical strength of the resultant substrate. The effect of raising the mechanical strength through adoption of the groove morphology specific to this invention becomes distinctive when a substrate as thin as 230 µm or below is adopted.

On the first main surface (having a surface orientation of {100}) of the as-cut, p-type silicon single crystal substrate 203 (203'), a texture structure is then formed by any publicly-known method. After the texture structure is formed, the substrate is cleaned in an acidic aqueous solution such as containing hydrochloric acid, sulfuric acid, nitric acid, hydrofluoric acid, or mixed solution thereof, where cleaning in hydrochloric acid is preferable from the viewpoints of economy and production efficiency. Purpose of the texture formation resides in surface roughening for reducing the reflection loss. The p-type silicon single crystal substrate 203 (203') after completion of the above processes is expressed by process (a) in FIG. 8.

On the first main surface (back surface) 203a (203a') of the p-type silicon single crystal substrate 203 (203'), an insulating film 204 (204') such as a silicon oxide film or silicon nitride film is formed by any publicly-known method, which is typified by the CVD (Chemical Vapor Deposition) process, to a thickness of 50 to 500 nm (process (b) in FIG. 8). Any of the normal-pressure thermal CVD process, reduced-pressure thermal CVD process, photo CVD process and so forth is applicable herein, where the remote plasma CVD process is particularly preferable for this invention, because the process can proceed at lower temperatures ranging from 350 to 400° C. or around, and can reduce the surface recombination speed of the resultant insulating film 204 (204') comprising silicon oxide or silicon nitride.

For the case where the second main surface (defined as the top surface in this embodiment, although not shown) is used as the light-receiving surface, it is also allowable in this stage to form the emitter layer (not shown) in the light-receiving surface by the vapor phase diffusion process using phosphoryl chloride, because the insulating film is also effective as a mask for blocking phosphorus diffusion. That is, diffusion of phosphorus into the first main surface 203a (203a') is blocked by the insulating film 204 (204') formed on the first main surface 203a (203a'). Other possible methods for forming the emitter layer include the coating diffusion method using diphosphorus pentaoxide, ion implantation method for directly implanting phosphorus ion, and so forth, where a preferable method from the economical viewpoint is the aforementioned vapor phase diffusion process. In an exemplary process, the n-type emitter layer can be formed by annealing the p-type silicon single crystal substrate in a phosphoryl chloride atmosphere at 850° C. or around. Thickness of the resultant emitter layer is typically 0.5 µm or around, and the sheet resistance falls within a range from 40 to 100 Ω/□ or around. A phosphorus glass formed in the surficial portion of the substrate during the process is removed in a hydrofluoric acid solution.

The n-type emitter layer is thus formed in the surficial portion of the second main surface (top surface) which serves as the light-receiving surface, and a p-n junction portion is thus formed in the substrate.

Next paragraphs will describe a method of forming the filled electrode lines 240 (240') on the first main surface 203a (203a') of the p-type silicon single crystal substrate 203 (203'). For the case where the filled electrode lines 240 are formed by first forming the grooves 202, a plurality of nearly-parallel groove portions are formed on the main surface 203a of the p-type silicon single crystal substrate 203 using a high-speed rotary blade, and by filling the groove portions 202 with the electric conductor 205 (processes (c) and (d) in FIG. 8). More specifically, the groove portions 202 for electrode contact are formed in the insulating layer 204. The groove portions 202 are carved typically in the <100> direction on the first main surface 203a of the substrate 203, using the high-speed rotary blade 107 as shown in FIG. 5A. Height and profile of the peripheral cutting edge 108 of the high-speed rotary blade 107 can properly be selected depending on desired morphology of the groove portions 202 to be formed on the first main surface 203a of the p-type silicon single crystal substrate 203. Height of the cutting edge is typically 50 to 100 µm, and width (corresponds with the width of the groove portions 202 to be formed) and pitch (corresponded with the pitch of the groove portions 202 to be formed) are several-hundred-micrometers or around, respectively. Using such high-speed rotary blade 107, the substrate is carved at a cutting speed of approx. 1 to 4 cm per second while injecting a cutting water, to thereby form the groove portions 202. The height and so forth of the peripheral cutting edge 108 are finely adjusted so as to adjust the depth of the groove portions 202 to approx. 5 to 50 µm. Because the thickness of the insulating film 204 formed on the first main surface 203a of the substrate 203 is approx. 50 to 500 nm, the groove portions 202 formed in the thickness within the above range can penetrate the insulating film 204. This successfully completes the filled electrode lines 240 in which the electric conductor 205 filled in the groove portions 202 contacts with the p-type silicon single crystal substrate 203.

Figure 9:
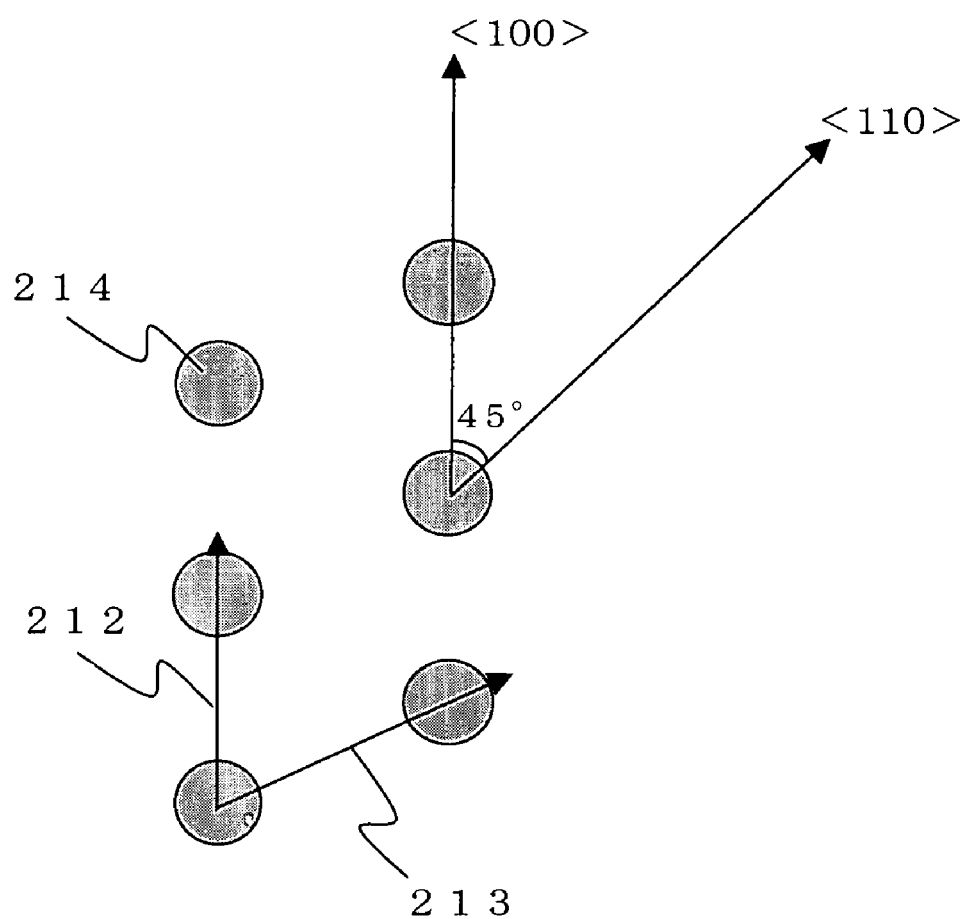
FIG. 9 is a drawing showing a relation between arrangement of holes for electrode contact and crystallographic orientation of the substrate of the solar cell according to the second aspect of this invention.

On the other hand, as shown in FIG. 10A and FIG. 10B, for the case where the solar cell 201' has the filled electrode lines 240' composed of the bottomed holes 214 bored in the p-type silicon single crystal substrate 203', the bottomed holes 214 are first linearly formed at regular intervals on the main surface 203a' side of the p-type silicon single crystal substrate 203' by irradiating laser thereon, so that the line connecting every closest bottomed holes 214 is in disagreement with the <110> direction. The bottomed holes 214 are then filled with the electric conductor 205' for composing the electrodes, to thereby complete the filled electrode lines 240'. Lasers available for forming the bottomed holes 214 include carbon dioxide gas laser, argon laser, YAG laser, ruby laser and excimer laser. Among others, excimer laser such as KrF laser and Nd:YAG laser can preferably be used because these lasers can ensure fine processing to as fine as wavelength of the laser beam, and the processing can be proceeded in the air. Any morphology of circular form and rectangular form are allowable for the bottomed holes 214. The bottomed holes 214 are linearly aligned while keeping regular intervals between every closest bottomed hole 214. Assuming now a set of thus-linearly-aligned bottomed holes 214 composes one filled electrode line 240', a plurality of the filled electrode lines 240' are periodically arranged on the first main surface 203a' while keeping regular intervals therebetween. FIG. 9 is a schematic drawing showing a relation between arrangement of the bottomed holes 214 and directionality of the substrate. The direction 212 of a line connecting every closest bottomed holes 214 formed by laser irradiation (direction of formation of the filled electrode line 240') is set in a direction in disagreement with the <110> direction on the main surface of the substrate 203'. It is preferable that also the direction 213 of a line connecting every second-closest bottomed hole, differing from the direction 212, is in disagreement with the <110> direction.

Conditions for the laser irradiation for forming the bottomed holes 214 can properly be determined depending on types of the laser, thickness of the insulating film 204', diameter of the bottomed holes 214, and so forth. For the case where pulse oscillation is adopted, the frequency is preferably within a range from 1 Hz to 100 kHz, and the laser preferably has an average output of 10 mW to 1 kW. Because the insulating film 204' formed herein has a thickness of 50 to 500 nm, it is necessary to irradiate laser having an output energy large enough to remove the insulating film 204' having at least the above-described thickness.

The filled electrode lines 240 (240') are thus formed by filling the groove portions 202 or bottomed holes 214 with the electric conductor 205 (205'), and the cover electrode layer 210 is formed in a thickness of 0.5 to 2 μm over the entire portion of the first main surface 203a (203a') (process (d) in FIG. 8). In this process, the electric conductor 205 (205') and cover electrode layer 210 are successively formed in the same process step, as being started from the status expressed by process (c) in FIG. 8.

While the electric conductor 205 (205') and cover electrode layer 210 can be composed of metals such as silver, copper and the like, or conductive indium oxide, tin oxide and the like, most preferable material is aluminum in view of economy and workability. The electric conductor 205 (205') and cover electrode layer 210 can be deposited by any known methods of sputtering, vacuum evaporation, screen printing and so forth. Moreover, the cover electrode layer 210 can, of course, be deposited by uniformly over the entire portion of the first main surface 203 (203') as described in the above, it is also allowable to form a linear or band-formed current collecting electrode 217 (also referred to as band electrode 217, hereinafter) on the filled electrode line 240' which is formed by filling the grooves (not shown) or bottomed holes 214 with the electric conductor 205 (205') as shown in FIGS. 10A and 10B typically using a mask for electrode formation. It is also allowable to form the current collecting electrode 217 having a linear form or band form in a direction at 4 to 90° away from the direction of formation of the filled electrode line 240'. This is successful in further raising the mechanical strength of the semiconductor single crystal substrate (p-type silicon single crystal substrate), and consequently of the solar cell. Although FIG. 10(a) and 10(b) showed the case where the filled electrode lines 240' were composed of the bottomed holes 214, the similar current collecting electrode 217 as described in the above can be formed also for the case where the filled electrode lines 240 are composed of the grooves 202.

After the electric conductor 205 for composing the electrodes, cover electrode layer 210 and the band-formed electrode 217 are formed on the first main surface 203a as described in the above, the anti-reflection film and electrodes are formed on the second main surface according to the publicly-known methods. Materials for composing the anti-reflection film include silicon oxide, silicon nitride, cerium oxide, alumina, tin dioxide, titanium dioxide, magnesium fluoride, tantalum oxide, and a double-layered film composed of any two of these materials, where all materials are available without any problems. The anti-reflection film can be formed by the PVD process, CVD process or the like, where any process is successful. In view of obtaining a high-conversion-efficiency solar cell, it is preferable to compose the anti-reflection film with a silicon nitride film formed by the remote-plasma CVD process, because thus-formed film has a small surface recombination speed. The electrodes on the second main surface (top surface) are formed by vacuum evaporation, plating, printing or the like. Although any of these methods are available, printing is preferably used in pursuit of a low cost and high throughput. Typical screen printing uses a silver paste composed of silver powder, glass frit and organic binder mixed with each other, and the electrodes can be formed by annealing the printed paste.

Which processes for the top surface (second main surface) and back surface (first main surface) should preceed is of no problem. Although the aforementioned embodiment described the case where the filled electrode lines 240 (240') are formed on the first main surface 203a (203a') of the p-type silicon single crystal substrate 203 (203'), and the second main surface is used as the light-receiving surface, this invention is by no means limited thereto, and similar effects will be shown by the solar cell in which the electrodes are composed of the filled electrode lines obtained by forming the grooves or bottomed holes on the second main surface which serves as the light-receiving surface.

To confirm operation and effects of the solar cells according to the first aspect of this invention, the following experiments were carried out.

EXAMPLE 1

On the first main surfaces of the boron-doped {100} p-type silicon single crystal substrates (specific resistance=1

Figure 12:
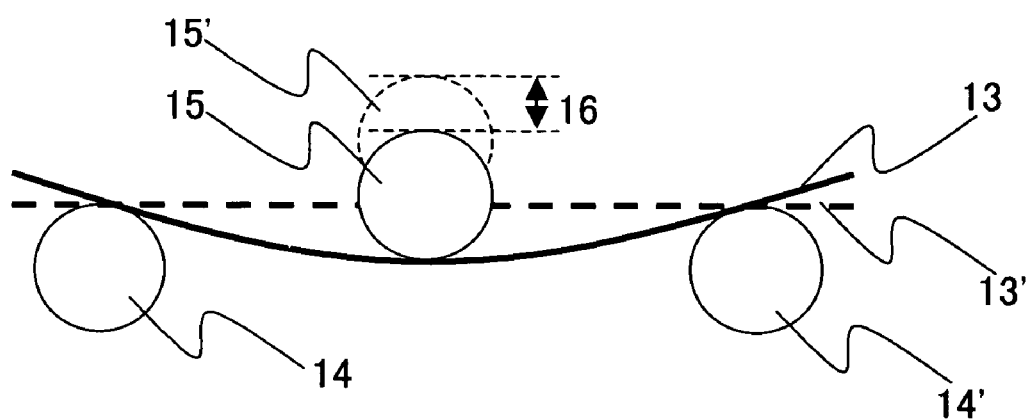
FIG. 12 is a drawing showing a setting of a test strip and definition of deflection in a deflection measurement test adopted in an experiment of an Example of this invention.

Ω·cm) respectively having either thickness of 250, 200 and 150 µm, parallel grooves having a rectangular section were formed respectively in either direction at angles of 0°, 30°, 45°, 60° and 90° to the <110> direction, using the high-speed rotary blade shown in FIG. 5A. Width, depth and pitch of the grooves were determined as 450 µm, 50 µm and 600 µm, respectively. The solar cells were fabricated according to the process steps previously described referring to FIG. 4. Energy conversion efficiency of the solar cells measured under the standard conditions were found to range from 18 to 20%. Each solar cell was cut into a test strip of 18 mm wide and 100 mm long using a dicer. The test strip was then set on a three-point bending tester as shown in FIG. 12 so that the test strip 13' was supported at both ends thereof by two round-rod support members 14, 14' (outer diameter of support portion=28 mm, span between the support portions=80 mm) while directing the groove-formed surface (first main surface) facedown, and also aligning the groove direction with the axial directions of the round-rod support members 14, 14'. Three point bending test was then carried out by contacting another round-rod support member 15' of same dimensions to the center of the longitudinal direction of a portion of the test strip 13' which falls between the round-rod support members 14, 14', and by applying a downward load for bending through the round-rod support member 15'. Maximum displacement 16 of the test strip 13 immediately before fracture was determined from a displacement-load curve of the round-rod support member 15', and this was defined as "deflection". The individual samples were measured in a similar manner.

For comparison, solar cells were fabricated using the silicon single crystal substrates having the individual thickness without forming the grooves, but by similarly carrying out etching for damage removal, texture formation, phosphorus diffusion, electrode formation using aluminum on the second main surface, and deposition of the silicon nitride film on the first main surface. The solar cells were then similarly subjected to the deflection measurement. The test pieces herein were cut out from the substrate so that the longitudinal direction thereof was in agreement with the <100> direction of the substrate. Therefore, the axial direction of the round-rod support members 14, 14' herein becomes in parallel with the <100> direction normal to another <100> direction that lies in parallel with the longitudinal direction of the test piece.

Figure 13:
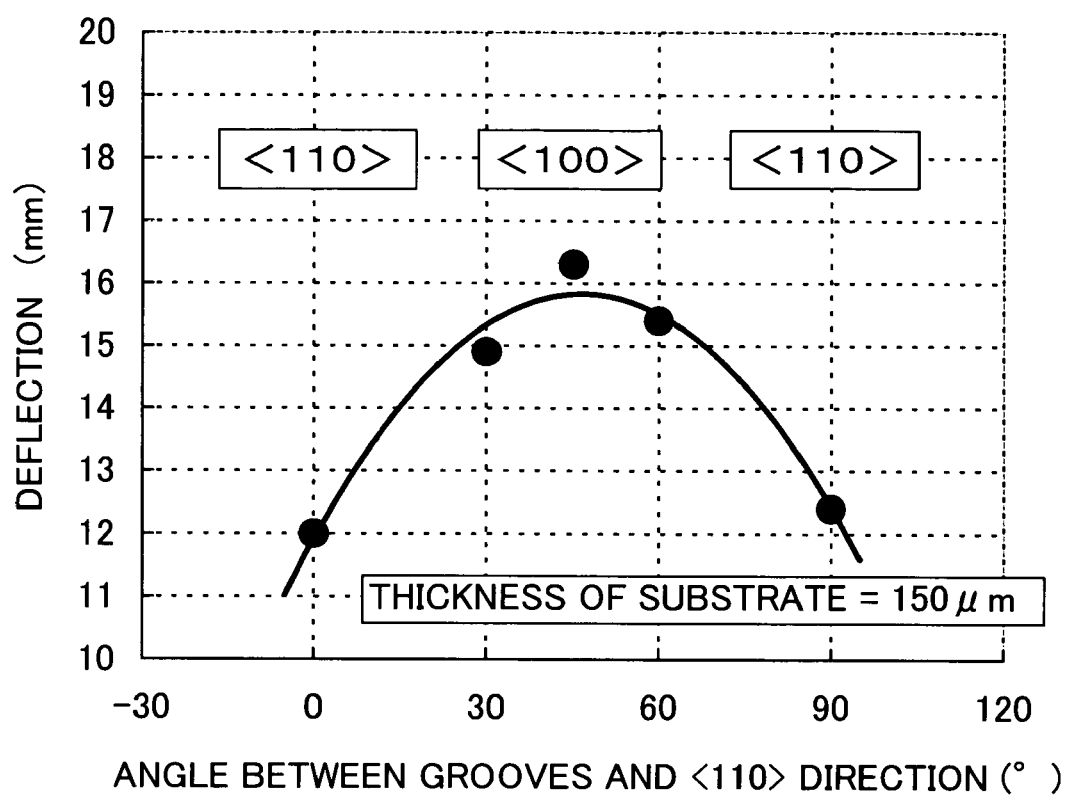
FIG. 13 is a graph showing a groove direction dependence of deflection of the substrate in Example 1.
Figure 14:
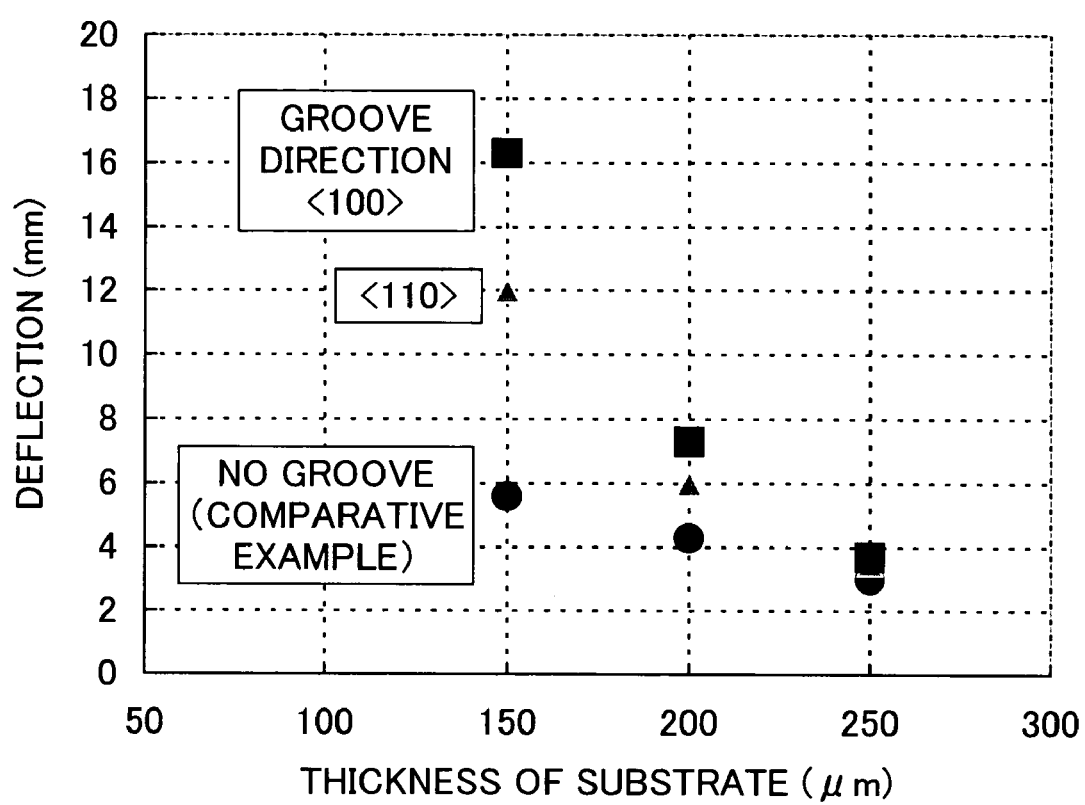
FIG. 14 is a graph showing a substrate thickness dependence of deflection of the substrate in Example 1, together with results of Comparative Example.

FIG. 13 shows a groove direction dependence of deflection of the 150-µm thick substrate. The curve indicates that the deflection becomes maximum when the groove direction is at 45° away from the <110> direction, that is, when the grooves are formed in the <100> direction, showing an excellent mechanical strength. FIG. 14 shows substrate thickness dependences of deflection in comparison with Comparative Example (no grooves). The results indicate that the deflection increases as the thickness of the substrate decreases, and effect of improving the mechanical strength through adjustment of the groove direction becomes more distinctive as the OECO solar cells are thinned. It is also found that the groove formation results in a larger deflection, and that the grooved substrate is more excellent in the mechanical strength.

Example 2

On the first main surfaces of the {100} p-type silicon single crystal substrates respectively having either thickness of 250, 200 and 150 µm, parallel grooves having a rectangular section were formed respectively in either direction at angles of 0° and 45° to the <110> direction by a method similar to as described in Example 1, and on the second main surfaces thereof, a plurality of grooves having a rectangular section were formed normal to the direction of formation of the grooves on the first main surface. Width, depth and pitch of the grooves were determined as 450 µm, 50 µm and 600 µm, respectively. The light-receiving element structures were formed on both main surfaces according to the method explained with reference to FIG. 4, to thereby fabricate a double-face-receiving-type OECO solar cell.

Figure 15:
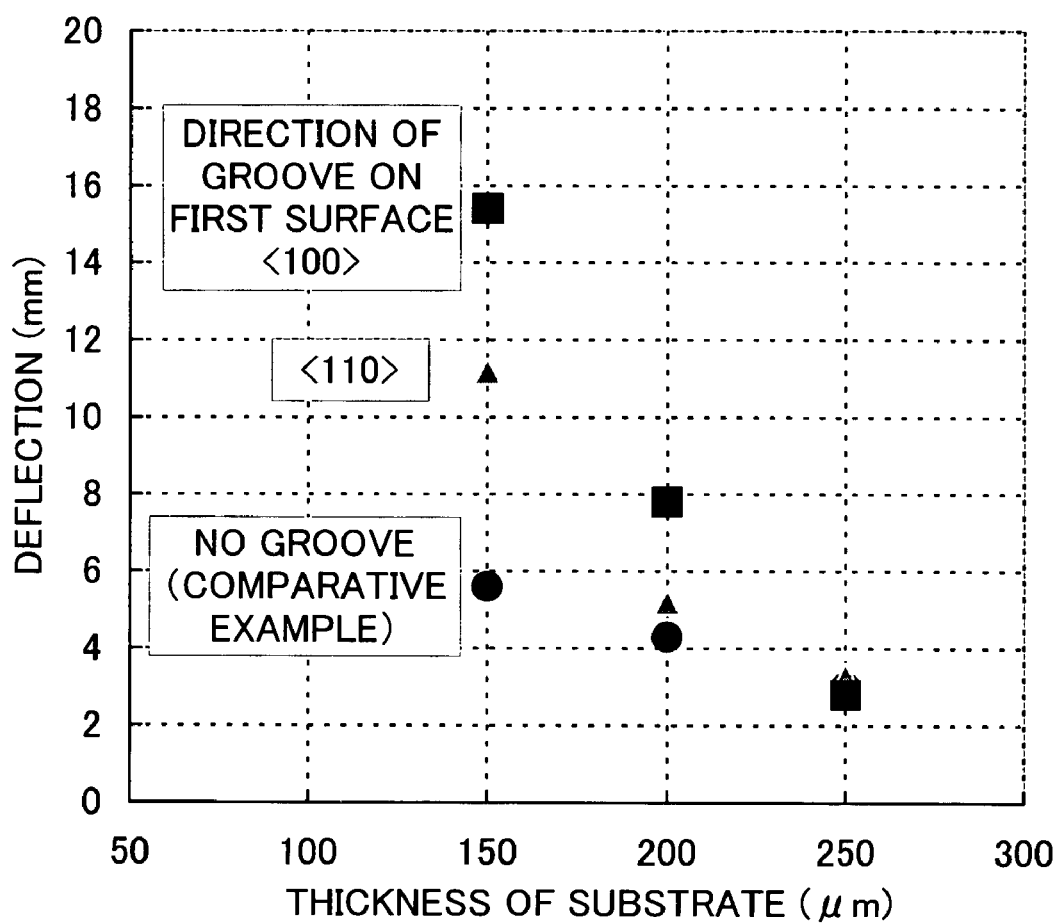
FIG. 15 is a graph showing a substrate thickness dependence of deflection of the substrate in Example 2, together with results of Comparative Example.

A schematic view of thus fabricated solar cell was shown in FIG. 11. Test pieces were cut out from these solar cells similarly to as described in Example 1, and subjected to the deflection measurement. Each test pieces was prepared so that the longitudinal direction thereof was in agreement with the groove direction on the first main surface side, and, during the measurement, was disposed so that the groove direction on the first main surface side was in parallel with the round-rod support members 14, 14'. FIG. 15 shows substrate thickness dependences of the deflection in comparison with Comparative Example. It was found that the deflection became maximum when the grooves were formed in the <100> direction and increased as the thickness of the substrate decreased, and an effect of improving the mechanical strength became more distinctive as the OECO solar cells were thinned.

As is obvious from the experimental results in the above, in the fabrication of the OECO solar cells, shifting of the groove direction from the <110> direction successfully raised the crack resistance and increased the mechanical strength of the solar cells (FIG. 13). In particular, the groove direction aligned with the <100> direction maximized the mechanical strength. This effect became more distinctive as the thickness of the substrate decreased (FIG. 14), and this proved an advantage in cost reduction of the solar cells. It was also made clear that the solar cell, having the grooves also on the second main surface which lay normal to those on the first main surface (FIG. 11), was also successful in retaining a mechanical strength almost equivalent to that shown by the solar cell having no groove (FIG. 15), and this proved that this invention is also advantageous in fabricating the double-face-receiving-type OECO solar cells.

To confirm operation and effects of the solar cells according to the second aspect of this invention, the following experiments were carried out.

Example 3

On the first main surfaces (back surface) of the boron-doped {100} p-type silicon substrates (specific resistance=1 Ω·cm) having a thickness of 150 µm, a silicon nitride film of 100 nm thick was formed, and parallel grooves were formed respectively in either direction at angles of 0°, 30°, 45°, 60° and 90° to the <110> direction, using a dicer (Model DAD-2H/6H, product of Disco Corporation). Width, depth and pitch of the grooves were determined as 450 µm, 50 µm and 600 µm, respectively. Aluminum was then deposited over the entire portion of the first main surface to thereby form a back electrode. On the second main surface (top surface, or light-receiving surface), the emitter layer, anti-reflection film, finger electrode and bus bar electrode were sequentially formed by the publicly-known methods, to thereby complete single-face-receiving-type solar cells. Conversion efficiencies of these solar cells were found to range from 15 to 17%.

These solar cells were cut using the dicer to produce 18×100 mm² test strips, and the test strips were subjected to the three-point bending test so as to measure deflection according to the system illustrated in FIG. 12.

Figure 16:
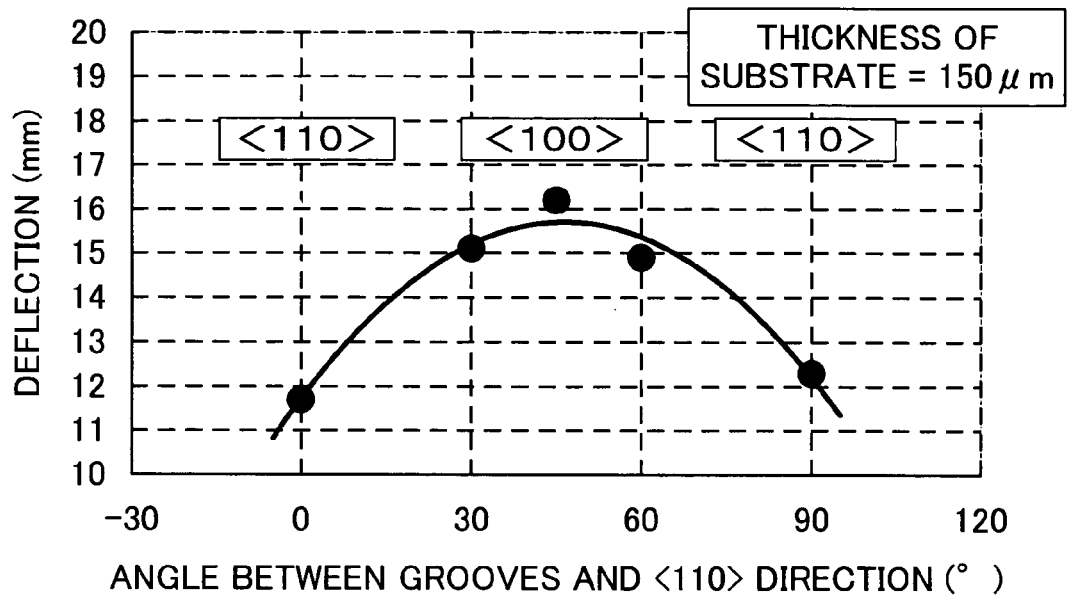
FIG. 16 is a graph showing a groove direction dependence of deflection of the substrate in Example 3.

FIG. 16 shows groove direction dependence of the deflection. The results indicate that the deflection becomes maximum when the groove direction is at 45° away from the <110> direction, that is, when the grooves are formed in the <100> direction, showing an excellent mechanical strength.

Example 4

On the back surfaces of the boron-doped {100} p-type silicon substrates (specific resistance=1 Ω·cm) having a thickness of 150 μm, which is similar to those used in Example 3, a silicon nitride film of 100 nm thick was formed, and a plurality of bottomed holes were formed using KrF excimer laser so that every closest bottomed holes are linearly aligned at regular intervals. Distance between the adjacent bottomed holes and diameter of the opening portion were set to 600 μm and 450 μm, respectively, and depth of the bottomed holes was set to approx. 50 μm by adjusting laser output (e.g., laser energy density=23.6 J/cm$^2$, oscillation frequency=100 Hz, continuous irradiation time=approx. 2.3 seconds). Assuming now that the angle between the direction of a line connecting every closest bottomed holes and the <110> direction as α°, and parallel grooves were formed respectively in either direction at angles α° of 0°, 30°, 45°, 60° and 90°. Aluminum was then deposited over the entire portion of the first main surface to thereby form a back electrode. On the second main surface (top surface, or light-receiving surface), the emitter layer, anti-reflection film, finger electrode and bus bar electrode were sequentially formed by the publicly-known methods, to thereby complete single-face-receiving-type solar cells. Conversion efficiencies of these solar cells were found to range from 14 to 17%.

These solar cells were cut using the dicer to produce 18×100 mm$^2$ test strips, and the test strips were subjected to the three-point bending test similarly to as described in Example 3.

Figure 17:
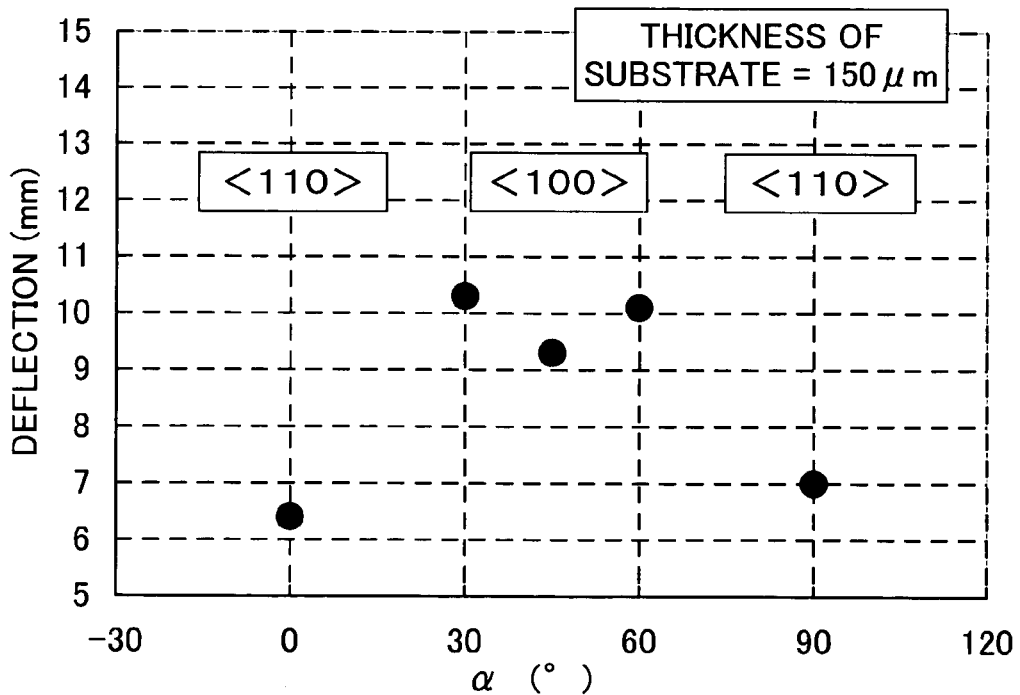
FIG. 17 is a graph showing an a dependence of deflection of the substrate in Example 4.

FIG. 17 shows α dependence of the deflection. The results indicate that the deflection becomes maximum when the groove direction is at around 30° and 60° away from the <110> direction, that is, when the line connecting every closest bottomed hole is in disagreement with the <110> direction, showing an excellent mechanical strength.

The invention claimed is:

1. A solar cell configured so as to have a plurality of grooves nearly parallel with each other formed on a first main surface of a semiconductor single crystal substrate having thickness of 150 to 200 μm and a surface orientation of nearly {100}, each of the grooves having an electrode for extracting output disposed on the inner side face thereof on one side in the width-wise direction thereof, and the grooves being formed on the first main surface in directions in disagreement with a <110> direction.

2. The solar cell as claimed in claim 1, wherein the direction of formation of each groove crosses the <110> direction nearest to the direction of formation at an angle of 4° to 45° on the acute angle side.

3. The solar cell as claimed in claim 2, wherein each of the grooves is formed in a direction parallel to a <100> direction on the first main surface.

4. The solar cell as claimed in claim 3, wherein a contour of each of the grooves in a sectional view normal to the longitudinal direction thereof has any one of rectangular, V- and semicircular forms.

5. The solar cell as claimed in claim 4, wherein a contour of each of the grooves in a sectional view normal to the longitudinal direction thereof has two edge portions abutted with each other, and the abutted portion of the edge portions is rounded.

6. The solar cell as claimed in claim 5, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

7. The solar cell as claimed in claim 4, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

8. The solar cell as claimed in claim 3, wherein a contour of each of the grooves in a sectional view normal to the longitudinal direction thereof has two edge portions abutted with each other, and the abutted portion of the edge portions is rounded.

9. The solar cell as claimed in claim 8, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

10. The solar cell as claimed in claim 3, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

11. The solar cell as claimed in claim 2, wherein a contour of each of the grooves in a sectional view normal to the longitudinal direction thereof has any one of rectangular, V- and semicircular forms.

12. The solar cell as claimed in claim 11, wherein a contour of each of the grooves in a sectional view normal to the longitudinal direction thereof has two edge portions abutted with each other, and the abutted portion of the edge portions is rounded.

13. The solar cell as claimed in claim 12, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

14. The solar cell as claimed in claim 11, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

15. The solar cell as claimed in claim 2, wherein a contour of each of the grooves in a sectional view normal to the longitudinal direction thereof has two edge portions abutted with each other, and the abutted portion of the edge portions is rounded.

16. The solar cell as claimed in claim 15, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

17. The solar cell as claimed in claim 2, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

18. The solar cell as claimed in claim 1, wherein a contour of each of the grooves in a sectional view normal to the longitudinal direction thereof has any one of rectangular, V- and semicircular forms.

19. The solar cell as claimed in claim 18, wherein a contour of each of the grooves in a sectional view normal to the longitudinal direction thereof has two edge portions abutted with each other, and the abutted portion of the edge portions is rounded.

20. The solar cell as claimed in claim 19, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

21. The solar cell as claimed in claim 18, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

22. The solar cell as claimed in claim 1, wherein a contour of each of the grooves in a sectional view normal to the longitudinal direction thereof has two edge portions abutted with each other, and the abutted portion of the edge portions is rounded.

23. The solar cell as claimed in claim 22, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

24. The solar cell as claimed in claim 1, configured so that a plurality of grooves nearly parallel with each other are formed also on a second main surface of the semiconductor single crystal substrate in directions in disagreement with the <110> direction on the first main surface and so as to cross the directions of formation of the grooves on the first main surface, and so that an electrode for extracting output is disposed on the inner side face of each groove on the second main surface on one side in the width-wise direction of the groove.

25. The solar cell as claimed in claim 24, wherein the directions of formation of the grooves on the second main surface cross nearly normal to the directions of formation of the grooves on the first main surface.

26. A solar cell configured so as to have recessed portions, formed so as to concave the main surface and to he aligned in a linear pattern on the main surface, and a plurality of filled electrode lines formed entirely in the recessed portions, having an electric conductor for composing electrodes for extracting output filled therein, on at least either main surface side of a semiconductor single crystal substrate having a surface orientation of nearly {100}, wherein the direction of formation of each filled electrode line crosses a <110> direction nearest to the direction of formation at an angle of 30° to 45° on the acute angle side on the main surface.

27. The solar cell as claimed in claim 26, wherein each of the electrode lines is formed in a direction parallel to the <100> direction on the main surface.

28. The solar cell as claimed in claim 27, wherein the filled electrode lines are formed on the first main surface of the semiconductor single crystal substrate, and the second main surface serves as a light-receiving surface.

29. The solar cell as claimed in claim 28, wherein an insulating film is formed on the first main surface of the semiconductor single crystal substrate, and the filled electrode lines are formed so that the electric conductor filled therein makes contact with the semiconductor single crystal substrate in a form that the filled electrode lines penetrate the insulating film.

30. The solar cell as claimed in claim 29, wherein a current collecting electrode communicating with the filled electrode lines formed on the first main surface is formed again on the first main surface.

31. The solar cell as claimed in claim 30, wherein the current collecting electrode is a cover electrode layer covering an entire portion of the first main surface.

32. The solar cell as claimed in claim 30, wherein the current collecting electrode is formed so as to have a band pattern or line pattern on the filled electrode lines.

33. The solar cell as claimed in claim 30, wherein the current collecting electrode is formed so as to have a band pattern or line pattern, and in the direction inclined at 4° to 90° away from the direction of formation of the filled electrode lines.

34. The solar cell as claimed in claim 26, wherein the filled electrode lines are formed on the first main surface of the semiconductor single crystal substrate, and the second main surface serves as a light-receiving surface.

35. The solar cell as claimed in claim 34, wherein an insulating film is formed on the first main surface of the semiconductor single crystal substrate, and the filled electrode lines are formed so that the electric conductor filled therein makes contact with the semiconductor single crystal substrate in a form that the filled electrode lines penetrate the insulating film.

36. The solar cell as claimed in claim 35, wherein a current collecting electrode communicating with the filled electrode lines formed on the first main surface is formed again on the first main surface.

37. The solar cell as claimed in claim 36, wherein the current collecting electrode is a cover electrode layer covering an entire portion of the first main surface.

38. The solar cell as claimed in claim 36, wherein the current collecting electrode is formed so as to have a band pattern or line pattern on the filled electrode lines.

39. The solar cell as claimed in claim 36, wherein the current collecting electrode is formed so as to have a band pattern or line pattern, and in the direction inclined at 4° to 90° away from the direction of formation of the filled electrode lines.

40. A method of fabricating a solar cell comprising a step of forming recessed portions, so as to concave the main surface and to be aligned in a linear pattern on the main surface, and a plurality of filled electrode lines entirely in the recessed portions, having an electric conductor for composing electrodes for extracting output filled therein, on at least either main surface side of a semiconductor single crystal substrate having a surface orientation of nearly {100}, wherein the direction of formation of each filled electrode line crosses a <110> direction nearest to the direction of formation at an angle of 30° to 45° on the acute angle side on the main surface.

41. The method of fabricating a solar cell as claimed in claim 40, wherein the filled electrode lines are formed by first forming a plurality of groove portions nearly parallel with each other on the main surface of the semiconductor single crystal substrate, and then by filling the groove portions with the electric conductor for composing electrodes.

42. The method of fabricating a solar cell as claimed in claim 40, wherein the filled electrode lines are formed by first forming a plurality of bottomed holes on the main surface of the semiconductor single crystal substrate by laser irradiation, the bottomed holes being linearly aligned at regular intervals, and the direction of a line connecting every closest bottomed holes crossing the <110> direction nearest to the direction of formation at an angle of 30° to 45° on the acute angle side, and then by filling the groove portions with the electric conductor for composing electrodes.

* * * * *